US009547387B2

(12) United States Patent
Choi et al.

(10) Patent No.: US 9,547,387 B2
(45) Date of Patent: Jan. 17, 2017

(54) METHOD FOR MANUFACTURING ORGANIC LIGHT EMITTING DISPLAY

(71) Applicant: LG DISPLAY CO., LTD., Seoul (KR)

(72) Inventors: Ho-Won Choi, Daegu (KR); Seung-Hyun Kim, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/921,432

(22) Filed: Oct. 23, 2015

(65) Prior Publication Data

US 2016/0041670 A1 Feb. 11, 2016

Related U.S. Application Data

(62) Division of application No. 13/712,167, filed on Dec. 12, 2012, now Pat. No. 9,202,408.

(30) Foreign Application Priority Data

Aug. 29, 2012 (KR) ........................ 10-2012-0095260

(51) Int. Cl.
| | | |
|---|---|---|
| H01L 51/40 | (2006.01) | |
| G06F 3/041 | (2006.01) | |
| G09G 3/32 | (2016.01) | |
| H01L 33/62 | (2010.01) | |
| H01L 27/32 | (2006.01) | |
| H01L 51/56 | (2006.01) | |

(52) U.S. Cl.
CPC ............ *G06F 3/0412* (2013.01); *G06F 3/041* (2013.01); *G09G 3/32* (2013.01); *H01L 27/323* (2013.01); *H01L 33/62* (2013.01); *H01L 51/56* (2013.01); *G06F 2203/04103* (2013.01); *H01L 2924/0002* (2013.01)

(58) Field of Classification Search
CPC ............ H01L 27/3244; H01L 51/5206; H01L 2251/301; G06F 3/04842; G06F 3/04847
USPC .............................................. 438/34, 82, 99
See application file for complete search history.

(56) References Cited

U.S. PATENT DOCUMENTS

| | | |
|---|---|---|
| 2005/0030264 A1 | 2/2005 | Tsuge et al. |
| 2005/0057580 A1 | 3/2005 | Yamano et al. |
| 2005/0168490 A1* | 8/2005 | Takahara ............. G09G 3/2014 345/690 |
| 2005/0180083 A1 | 8/2005 | Takahara et al. |

(Continued)

FOREIGN PATENT DOCUMENTS

| | | |
|---|---|---|
| CN | 1645978 A | 7/2005 |
| CN | 101713877 A | 5/2010 |

(Continued)

OTHER PUBLICATIONS

Office Action dated Oct. 29, 2015 for corresponding Chinese Patent Application No. 201210586930.0, 6 pages.

(Continued)

*Primary Examiner* — Andy Huynh
(74) *Attorney, Agent, or Firm* — Brinks Gilson & Lione (57) ABSTRACT

A method for manufacturing an organic light emitting display comprises forming a touch pad portion in a part of a dead region of the second buffer layer and the touch pad portion comprises a plurality of touch pads and each of the touch pads comprises a metal pad layer and a transparent electrode pad layer connected to each other via a plurality of first contact holes in a first insulating film.

11 Claims, 9 Drawing Sheets

(56) References Cited

U.S. PATENT DOCUMENTS

| | | |
|---|---|---|
| 2008/0278070 A1 | 11/2008 | Kim |
| 2010/0316790 A1 | 12/2010 | Li |
| 2012/0075243 A1 | 3/2012 | Doi et al. |
| 2013/0147727 A1 | 6/2013 | Lee et al. |

FOREIGN PATENT DOCUMENTS

| | | |
|---|---|---|
| CN | 101889257 A | 11/2010 |
| EP | 1 557 891 A2 | 7/2005 |
| EP | 1557891 A2 | 7/2005 |
| EP | 2221712 A1 | 8/2010 |
| JP | 2010-282171 | 12/2010 |
| JP | 2011-204664 | 10/2011 |
| JP | 2011-238259 | 11/2011 |
| TW | 200733445 | 9/2007 |
| TW | 200937089 A | 9/2009 |
| WO | WO 2010/040289 A1 | 4/2010 |

OTHER PUBLICATIONS

Search Report dated Oct. 19, 2015 for corresponding Chinese Patent Application No. 201210586930.0, 4 pages.

Extended European Search Report issued in corresponding European Patent Application No. 12196643.6, mailed Jan. 2, 2014, 8 pages.

Office Action issued in corresponding Japanese Patent Application No. 2012-278134, mailed Feb. 20, 2014, 2 pages.

Office Action issued in Taiwanese Patent Application No. 101146916, mailed Feb. 13, 2015, 4 pages.

\* cited by examiner

METHOD FOR MANUFACTURING ORGANIC LIGHT EMITTING DISPLAY

This application is a Divisional of U.S. patent application Ser. No. 13/712,167 filed on Dec. 12, 2012, which claims the benefit of priority of Korean Patent Application No. 10-2012-0095260, filed on Aug. 29, 2012, which is hereby incorporated by reference as if fully set forth herein.

BACKGROUND

Field of the Disclosure

The present disclosure relates to an organic light emitting display, and more particularly, to an organic light emitting display that enables realization of a thin film shape and flexibility, and exhibits superior contact properties based on an improved structure, and a method for manufacturing the same.

Discussion of the Related Art

Examples of flat panel displays include liquid crystal displays (LCDs), organic light emitting displays (OLEDs), plasma display panels (PDPs), quantum dot panels (PDPs), field emission displays (FEDs), electrophoretic displays (EPDs) and the like. These displays include a flat display panel realizing an image in common as an essential component. Such a flat display panel has a configuration in which a pair of transparent insulating substrates are joined together such that they face each other via a layer containing an inherently luminescent or polarizing material or other optical material interposed therebetween.

In accordance with the recent trend toward large-size displays, demand for flat panel displays that occupy a smaller space gradually increases. Of these flat panel displays, organic light emitting display technologies are being rapidly developed.

Organic light emitting displays do not require any separate light source and include an organic light emitting diode that spontaneously emits light in each pixel, to realize display. The organic light emitting displays attract much attention as next-generation displays since they advantageously do not require light sources as well as structures for assembling the light sources with a display panel, thus having advantages of decrease in thickness and weight.

When electric charges are injected into an organic film formed between an electron injection electrode (cathode) and a hole injection electrode (anode), electrons pair with holes and the pairs then decay. At this time, an organic light emitting diode emits light.

Meanwhile, there is increasing demand for addition, to an organic light emitting display, of a touchscreen in which a site touched by the hand or separate input element is sensed and information is transferred in response thereto. Such a touchscreen is being applied by adhesion to the outer surface of the display.

Depending on touch sense method, a touchscreen is divided into resistive, capacitive and infrared sensing types. In consideration of ease of manufacture, sensing force and the like, capacitive type touchscreens attract much attention in small models.

Hereinafter, a touchscreen-integrated organic light emitting display of related art will be described with reference to the annexed drawings.

Figure 1:
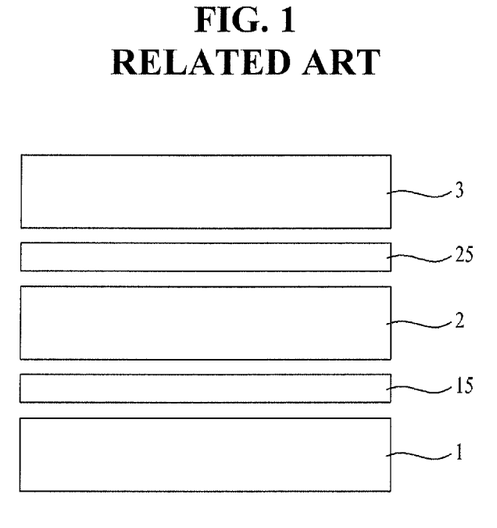
FIG. 1 is a sectional view illustrating a touchscreen organic light emitting display of related art.

FIG. 1 is a sectional view illustrating a touchscreen organic light emitting display of related art.

As shown in FIG. 1, the touchscreen-integrated organic light emitting display of related art includes an organic light emitting display panel 1, a touchscreen 2 and a cover window 3 laminated in this order from the bottom and includes first and second adhesive layers 15 and 25 disposed between the respect layers.

Here, the organic light emitting display panel 1 includes a substrate, a thin film transistor array having a matrix form disposed on the substrate, and an organic light emitting diode connected to each thin film transistor of the thin film transistor array, and includes a protective film and a polarizing layer that cover the top of the organic light emitting diode. In this case, the first adhesive layer 15 corresponds to the polarizing layer of the organic light emitting display panel 1. Also, the second adhesive layer 25 is formed between the touchscreen 2 and the cover window 3 to adhere the touchscreen 2 to the cover window 3.

The touchscreen-integrated organic light emitting display of related art has the following disadvantages.

First, in a case in which an organic light emitting display panel and a touchscreen are independently formed and the touchscreen is then attached to the organic light emitting display panel, the organic light emitting display panel and the touchscreen require separate glasses, thus causing increase in hardness and thickness, which makes realization of thin and flexible organic light emitting displays impossible.

Second, the organic light emitting display panel and the touchscreen have different panel shapes, thus making processes for forming these components complicated and thus decreasing yield and price competitiveness.

Third, in an in-cell type touchscreen configuration in which a pad portion of the touchscreen faces an inside, that is, a side of a pad portion of an organic light emitting display panel, a bonding process is performed using a sealant including conductive balls. In this case, relatively small conductive balls may have contact defects due to difference in diameter between the conductive balls. Also, a compression level of conductive balls is changed depending on a pressure applied during bonding and contact defects may thus occur during the bonding process.

SUMMARY

An organic light emitting display includes a transistor-organic light emitting diode array and a touch electrode array on a first buffer layer and a second buffer layer, respectively, that have an active region and a dead region and face each other, the organic light emitting display including: a touch pad portion disposed in a part of the dead region of the second buffer layer; a plurality of touch pads spaced from one another in the touch pad portion, each of the touch pads including a metal pad layer and a transparent electrode pad layer connected to the metal pad layer via a plurality of first contact holes in a first insulating film; a dummy pad portion disposed in the dead region of the first buffer layer, the dummy pad portion including each dummy pad corresponding to each touch pad; and a sealant including a plurality of conductive balls between the touch pad portion and the dummy pad portion.

In accordance with another aspect of the present invention, provided is a method for manufacturing an organic light emitting display including: forming a first etching stopper film and a first buffer layer on a first substrate, and forming a transistor-organic light emitting diode array having a transistor in each of pixels defined in a matrix form and an organic light emitting diode connected to the thin film transistor in an active region of the first buffer layer; forming a second etching stopper film and a second buffer layer on a second substrate and forming a touch electrode array in the active region of the second buffer layer; forming a touch pad portion in a part of the dead region of the second buffer layer, wherein the touch pad portion comprises a plurality of touch pads and each of the touch pads comprises a metal pad layer and a transparent electrode pad layer connected to each other via a plurality of first contact holes in a first insulating film; forming a dummy pad portion in the dead region of the first buffer layer, wherein the dummy pad portion comprises a plurality of dummy pads, each dummy pad corresponding to each touch pad; and applying a sealant including a conductive ball to the touch pad portion or the dummy pad portion, attaching an adhesive layer to the touch electrode array or the transistor-organic light emitting diode array and joining the first substrate to the second substrate.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and simultaneously with the description serve to explain the principle of the invention. In the drawings.

DETAILED DESCRIPTION OF THE EXEMPLARY

Reference will now be made in detail to the preferred embodiments of the present invention, examples of which are illustrated in the accompanying drawings. Wherever possible, the same reference numbers will be used throughout the drawings to refer to the same or like parts.

Hereinafter, an organic light emitting display and a method for manufacturing the same will be described in detail with reference to the annexed drawings.

In recent years, there is increasing demand for touch sensing as well as thinness and flexibleness of organic light emitting displays. In response to this, a method in which a thin film transistor and an organic light emitting array are formed on a first substrate, a touch electrode array is formed on a second substrate, these substrates are joined together, and the hard and thick first and second substrates are removed by laser irradiation or etching in order to realize thin film and flexibility is suggested. In this case, a pad portion of the touch electrode array faces a pad portion of the organic light emitting array, and these pad portions are connected to each other via a conductive ball, thus enabling transfer of signals to the touch electrode array and detection of signals from the touch electrode array.

Hereinafter, an in-cell organic light emitting display in which a touch electrode array is provided inside a cover glass will be described.

Figure 2:
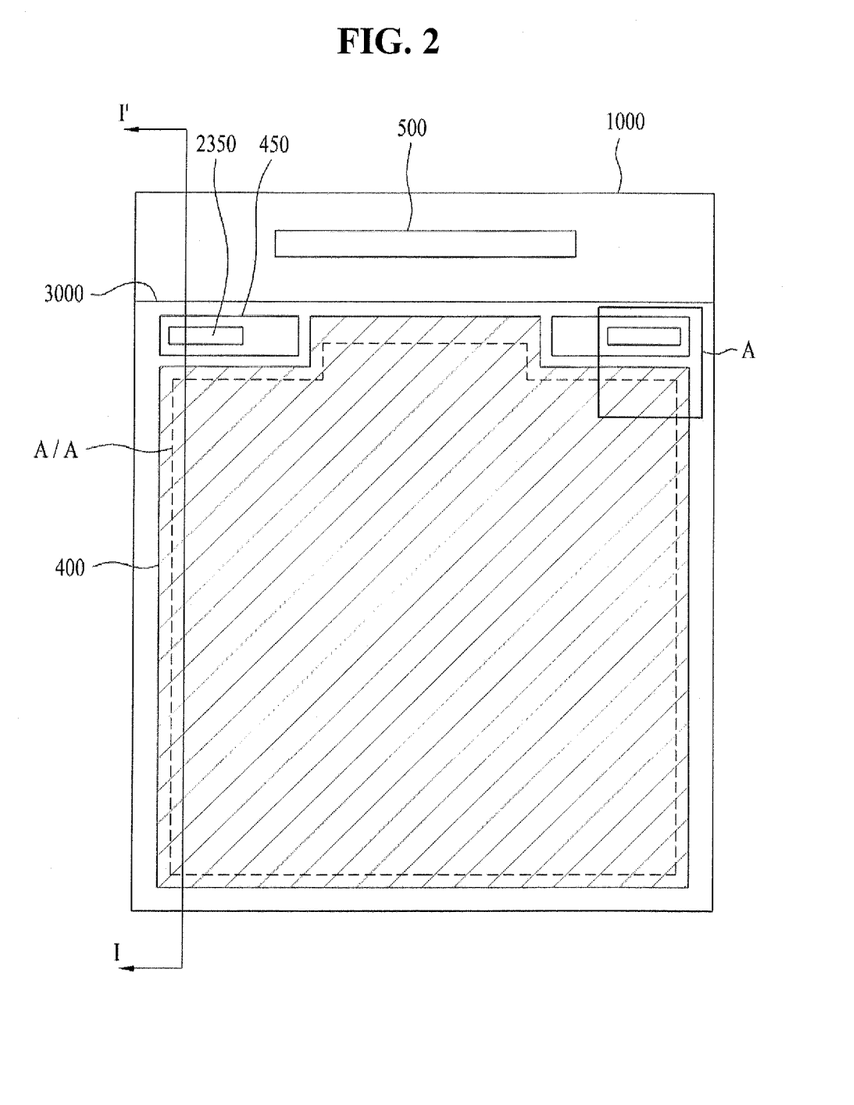
FIG. 2 is a plan view illustrating an organic light emitting display according to an embodiment of the present invention.
Figure 3:
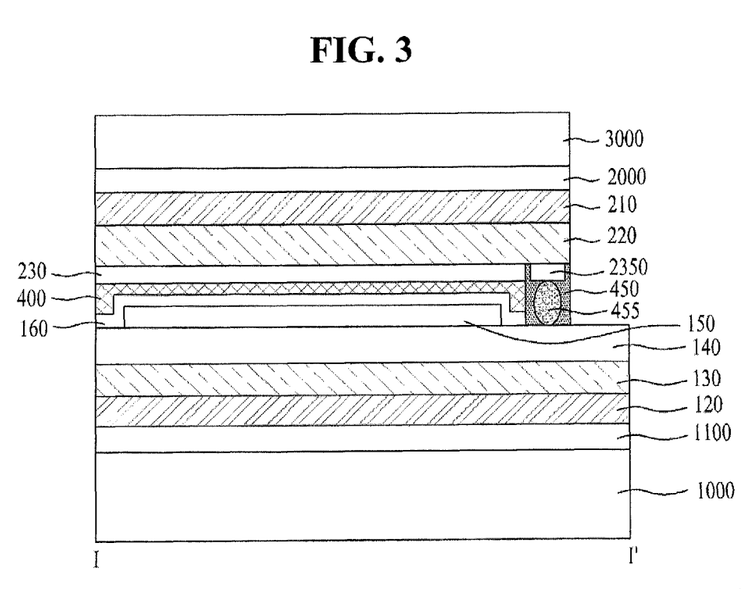
FIG. 3 is a sectional view taken along the line I-I' of FIG. 2.
Figure 4:
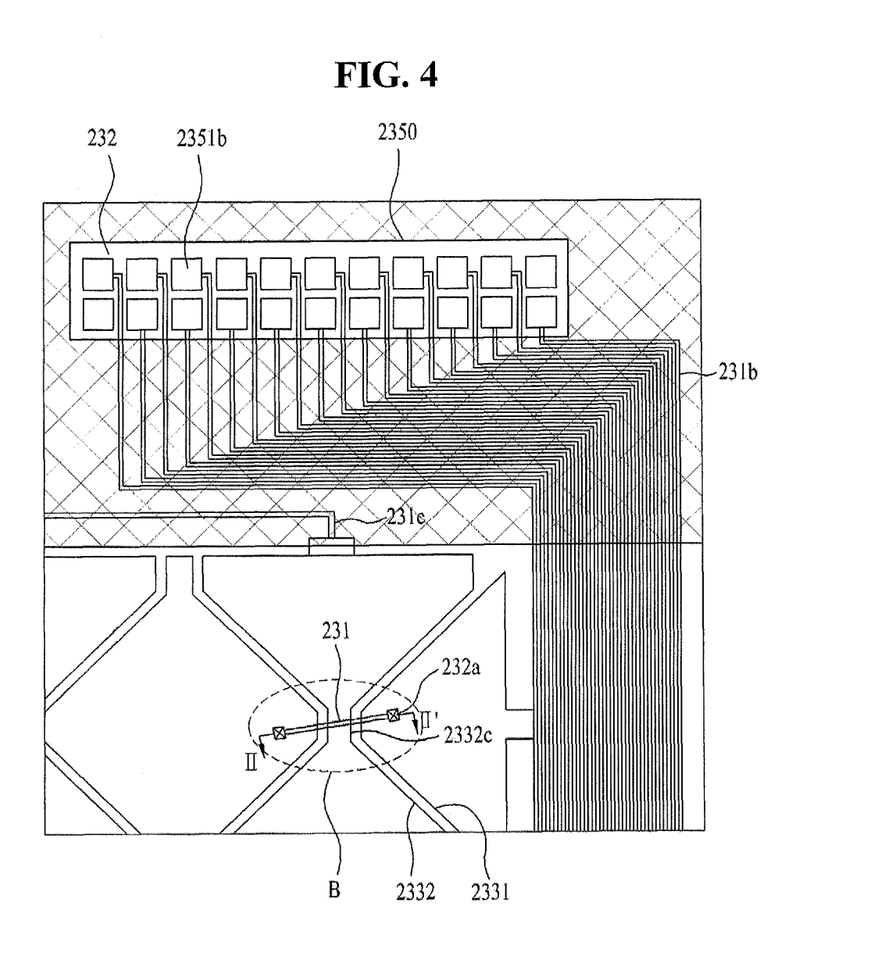
FIG. 4 is an enlarged plan view of a region "A" of FIG. 2.

FIG. 2 is a plan view illustrating an organic light emitting display according to the present invention. FIG. 3 is a sectional view taken along the line I-I' of FIG. 2. FIG. 4 is an enlarged plan view of a region "A" of FIG. 2.

As shown in FIG. 2 and FIG. 3, the organic light emitting display according to the present invention has a configuration in which an organic light emitting array 150 and a touch electrode array 230, that are formed at an inside of a film substrate 1000 and at an inside of a cover glass 3000, respectively, and have different sizes, are joined to each other via an adhesive layer 400.

Also, a polarizing plate 2000 is disposed under the cover glass 3000, which functions to prevent emission of incident light in order to solve a problem in which exterior light incident upon the organic light emitting display is reflected and is seen by a viewer.

Also, these arrays are not directly formed on the film substrate 1000 or the cover glass 3000 and are obtained by separately preparing first and second substrates (both, not shown), each being made of glass, joining the substrates via an adhesive layer disposed between the organic light emitting array 150 and the touch electrode array 230 (that is, this joining process is performed while keeping the first and second substrates), and removing the first and second substrates by laser irradiation or etching for realization of thin film and flexibility. In this case, as shown in FIG. 2, the first and second substrates formed of glass materials are removed and the film substrate 1000 and the cover glass 3000 are adhered to the bottom of the exposed arrays, respectively, in order to protect these arrays.

Here, a film adhesive layer 1100, a first etching stopper layer 120, a first buffer layer 130 and a thin film transistor array 140 and an organic light emitting array 150 are formed on the film substrate 1000 in this order and a protective layer 160 is formed to cover the organic light emitting array 150. A second etching stopper layer 210, a second buffer layer 220 and a touch electrode array 230 are disposed on the cover glass 3000. Here, the touch electrode array 230 is disposed to face the organic light emitting array 150. In this case, the protective layer 160 directly contacts the bottom of the adhesive layer 400 and the touch electrode array 230 directly contacts the top thereof.

An active region and a dead region are defined in the first buffer layer 130 and the second buffer layer 220, respectively, and the touch electrode array 230, the organic light emitting array 150 and thin film transistors present in the thin film transistor array 140 excluding a pad portion are formed in the active region. Also, the touch electrode pad portion 2350 and the pad portion of the thin film transistor array are defied in part regions of the dead region.

Here, the first etching stopper layer 120 and the second etching stopper layer 210 function to prevent damage to an internal array, in addition to the glass materials of first and second substrates during laser irradiation or etching. If desired, the first and second buffer layers 130 and 220 disposed thereunder are not damaged during removal of the first and second substrates, the first and/or second etching stopper layers 120 and 210 may be omitted.

Also, the first buffer layer 130 and the second buffer layer 220 may be formed by sequentially laminating the same type of inorganic film such as an oxide film (SiO2) or nitride film (SiNx), or alternatively laminating different types of inorganic films. The first and second buffer layers 130 and 220 serve as barriers that prevent permeation of moisture or exterior air into the organic light emitting array 150 after the second substrate is joined to the first substrate.

Also, both the touch pad portion 2350 and the touch electrode array 230 are formed on the same surface of the second buffer layer 220.

The touch pad portion 2350 is connected to the pad portion of the thin film transistor array 140 via a sealant 450 including a conductive ball 455, when the upper and lower substrates are joined to each other via the adhesive layer 400. The adhesive layer 400 functions to prevent permeation of moisture and directly contacts the protective layer 160 that covers the organic light emitting array 150, thus preventing permeation of exterior air into the organic light emitting array 150 and more certainly prevents permeation of moisture, in addition to the functions of the protective layer 160.

Here, the thin film transistor array 140 including the pad portion has a side that protrudes from the touch electrode array 230. This configuration aims at providing, at the protrusion, an IC 500 that transfers a signal to simultaneously drive the touch electrode array and the thin film transistor array, and the organic light emitting array. Although not shown, the IC 500 is connected through lines (not shown) formed on the IC 500 and the first buffer layer 130 to driving pads and dummy pads of the thin film transistor array. Also, the IC 500 is bonded and connected to a flexible printed circuit board (FPCB, not shown) and may be controlled by a controller (not shown) provided in the FPCB. The dummy pad is formed in the same layer as a metal constituting a gate or data line in a region corresponding to the touch pad portion among the dead region disposed out of the active region.

The touch pad portion 2350 is formed on the second buffer layer 220 and is formed at both edges of the side adjacent to a portion where the first buffer layer 130 protrudes more than the second buffer layer 220. Also, the touch pad portion 2350 formed at one edge is divided into a plurality of pad electrodes to enable voltage application or detection of first electrodes arrayed in an X-axis direction in the touch electrode array, and the touch pad portion 2350 formed at the other edge is divided into a plurality of pad electrodes to enable voltage application or detection of second electrodes arrayed in an Y-axis direction.

The conductive ball 455 connected to the touch pad portion 2350 is electrically connected to a dummy electrode (not shown) formed out of the thin film transistor array 140.

Here, during an actual process, the adhesive layer 400 and the sealant 450 are separately formed by application to different regions.

Meanwhile, as shown in FIG. 3, the organic light emitting display according to the present invention includes a film substrate 1000, a first etching stopper film 120 and a first buffer layer 130 formed in this order on the film substrate 1000, a thin film transistor array 140 having a thin film transistor in each pixel defined in a matrix form on the first buffer layer 130, an organic light emitting array 150 connected to the thin film transistor of each pixel, a protective layer 160 that covers the thin film transistor array 140 excluding the pad portion and the organic light emitting array 150, a touch electrode array 230 adhered to the protective layer via an adhesive layer 400 interposed between the protective layer 160 and the touch electrode array 230, and a second buffer layer 220 and a second etching stopper film 210 formed in this order on the touch electrode array 230, and includes a cover glass 3000 disposed on the second etching stopper film 210.

Here, the cover glass 3000 may be adhered to the second etching stopper film 210 via an adhesive layer, interposed between the second etching stopper film 210 and the cover glass 3000, or may be disposed on the second etching stopper film 210 by a mechanical method or another method. The cover glass 3000 prevents damage to internal array from direct touch of a user and protects the internal array therefrom.

The organic light emitting display according to the present invention can be reduced in thickness by omitting a glass substrate having a thickness of about 0.7 mm, which is the thickest of components in the display, and can realize a bendable or flexible display using the film substrate 1000 as a plastic insulating film that functions to support the thin film transistor array 140, the organic light emitting array 150 and the touch electrode array 230.

In addition, in the process of forming arrays such as the thin film transistor array 140, the organic light emitting array 150 and the touch electrode array 230 on the film substrate, the film substrate is thermally expanded by heat applied to apparatuses for depositing or patterning the arrays, thus making normal processing impossible. In order to prevent this phenomenon, substantially, formation of arrays is carried out by forming etching stopper films 120 and 210 and buffer layers 130 and 220 under the thin film transistor array 140 and the touch electrode array 230, respectively, on the glass substrate, before formation of the thin film transistor array 140 and formation of the touch electrode array 230, and then loading the glass substrate in an apparatus for deposition or patterning.

Meanwhile, the thin film transistor array 140 includes a plurality of gate lines and a plurality of data lines that intersect each other to define pixels, and thin film transistors formed at the respective intersections between the gate lines and the data lines. A pad portion of the thin film transistor array 140 is obtained by forming a pad portion metal in the process of forming the gate and data lines.

Also, the organic light emitting array 150 includes a first electrode formed at least in the pixel, a second electrode formed in an upper layer spaced from the first electrode, and an organic light emitting layer formed between the first and second electrodes. Here, the first electrode may be connected to a drain electrode of the thin film transistor.

In addition, the first etching stopper film 120 and the second etching stopper film 210 may be for example formed of polyimide or photo-acryl.

The first and second etching stopper films 120 and 210 have a thickness of about 1 µm to about 20 µm.

Also, the first buffer layer 130 and the second buffer layer 220 function to prevent permeation of oxygen or moisture into organic films provided in the organic light emitting array and serve as barriers that prevent permeation of exterior air or moisture injected from a lower part.

The first buffer layer 130 and the second buffer layer 220 include a plurality of inorganic films. For example, the inorganic films may be formed by continuously or alternatively laminating SiNx or SiO2. It can be seen from experimentation that, when two or more layers are laminated to a thickness of about 5,000 Å to 6,500 Å as the first and second buffer layers 130 and 220, permeation of exterior air or moisture can be prevented. A total thickness of the first and second buffer layers 130 and 220 is 1 µm or less, which does not increase the thickness of the touchscreen-integrated display device.

As shown in FIG. 4, the touch electrode array 230 includes a first transparent channel electrode 2331 and a second transparent channel electrode 2332 that intersect each other, and a touch pad 2351b (provided in a touch pad portion 2350) to transfer a signal to the first and second transparent channel electrodes 2331 and 2332. The touch pad 2351b may be connected to a dummy pad (see FIG. 10a) formed in the thin film transistor array. A thin film transistor array 140 including the dummy pad is shown in FIG. 3 and a touch electrode layer is shown in the form of a single layer including the touch pad, and the first and second transparent channel electrodes 2331 and 2332, but these layers are patterned according to respective electrodes.

Here, the first and second transparent channel electrodes 2331 and 2332 are formed of a transparent electrode, the touch pad 2351b includes a metal pad layer that has high conductivity and superior light-shielding properties (the same layer as the metal bridge 231), and a transparent electrode pattern (represented by 235a in FIG. 6A) which is the same layer as the transparent electrode constituting the first and second transparent channel electrodes 2331 and 2332. Also, the first and second transparent channel electrodes 2331 and 2332 may be disposed in the same layer or different layers. For example, as shown in the drawing, when the first and second transparent channel electrodes 2331 and 2332 are present in the same layer, a separate metal bridge 231 that contacts the first transparent channel electrodes 2331 or the second transparent channel electrodes 2332 adjacent to other layers is provided at the intersection between the first and second transparent channel electrodes 2331 and 2332, to prevent short-circuit between the first and second transparent channel electrodes 2331 and 2332. Meanwhile, not-described reference numeral "2332c" represents an electrode connection portion that passes through the first transparent channel electrodes 2331 spaced from one another and connects the upper and lower second transparent channel electrodes 2332 in an integrated form.

Figure 5:
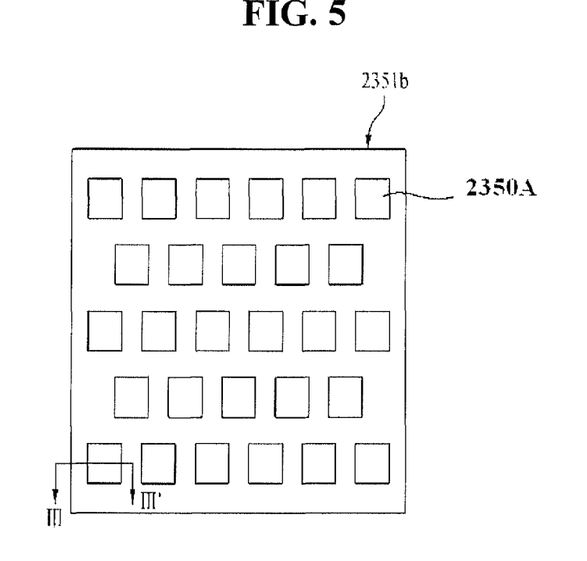
FIG. 5 is an enlarged plan view of one touch pad of FIG. 4.
Figure 6A:
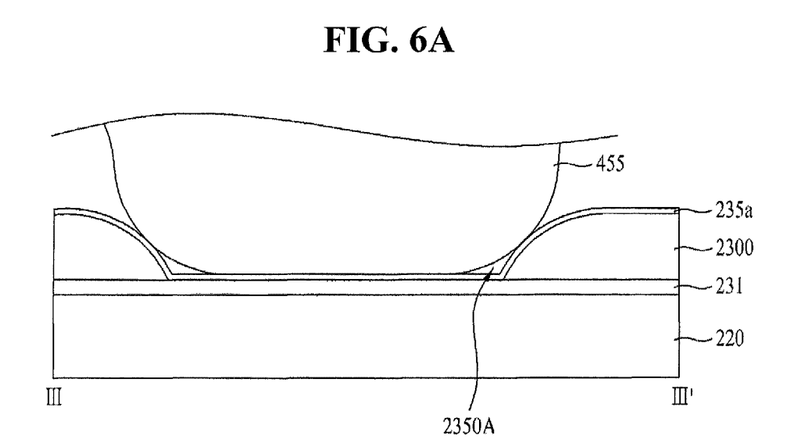
FIG. 6A is a sectional view taken along the line III-III' of FIG. 5.
Figure 6B:
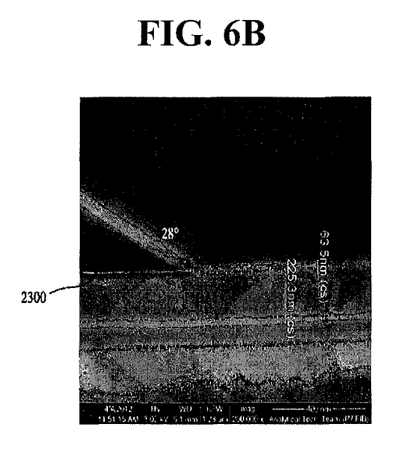
FIG. 6B is an SEM image showing a side of a contact hole of FIG. 6A.

FIG. 5 is an enlarged plan view of one touch pad of FIG. 4. FIG. 6A is a sectional view taken along the line of FIG. 5. FIG. 6B is an SEM image showing a side of a contact hole of FIG. 6A.

A plurality of touch pads 2351b provided in the touch pad portion 2350, as shown in FIGS. 5 and 6A, includes a metal pad layer 231a and a transparent electrode pad layer 235a connected to each other via an insulating film 2300 including a plurality of first contact holes 2350A between the layers.

Here, a plurality of first contact holes 2350A formed in one touch pad 2351b are spaced from one another and are arrayed in m and n lines and first contact holes arrayed in odd and even lines are disposed at alternate positions. The width of each first contact hole 2350A is smaller than a diameter of each conductive ball 455, and contact areas and number of contact sites between the conductive ball 455 and the touch pad 2351b are preferably increased according to the first contact holes 2350A of each conductive ball 455.

Here, the reason for the first contact holes 2350A provided in the touch pad 2351b is that the conductive ball 455 secures more contact sites and large contact areas, as compared to flat surface when pressurized during a bonding process. Also, the pressure is distributed through the first contact holes 2350A during the bonding process, thereby preventing breakage or cracking of the relatively soft and weak transparent electrode pad layer. In particular, as shown in FIG. 6A, the conductive ball 455 side-contacts the sidewall of the respective first contact holes 2350A and thus has electric contact sites in addition to plane contact sites. In particular, when the first contact hole 2350A is arrayed in plural, there is a high probability of such contact.

Also, the first contact holes 2350A may be alternately disposed in even and odd lines. In such alternate disposition, in preparation of a case in which the first contact holes 2350A are disposed at the same position in respective lines, a probability of the first contact hole 2350A contacting the conductive ball 455 is high, although the conductive ball 455 moves.

Meanwhile, here, the insulating film 2300 may have a mono- or multi-layer structure and may include at least one organic film.

FIG. 6B is an SEM image showing a sidewall of the first contact hole 2350A when tested under the conditions that a width and a length of the first contact hole 2350A are 10 µm and 10 µm, respectively, and the distance between the first contact holes 2350A disposed in the same line, and the distance of the first contact holes 2350 As disposed in the same row are 5 µm. In the SEM image, the insulating film 2300 which is thicker than the transparent electrode pad layer 235a is mainly observed on the sidewall.

Meanwhile, in the test, the sidewall has a tapered shape, forming an angle of about 28 degrees with the surface of the metal pad layer 231a, but the present invention is not necessarily limited thereto. Since side-contact of the conductive ball 455 should be possible in the first contact hole 2350A, regarding the shape of a predetermined part of the sidewall, a tapered shape is preferable to a vertical shape. For example, the sidewall that may be provided in the first contact hole 2350A is preferably a tapered shape forming an angle of 55 degrees or less with the surface of the second buffer layer 220.

Such a touch pad 2351b is formed through the same process as the touch electrode array 230.

Figure 7:
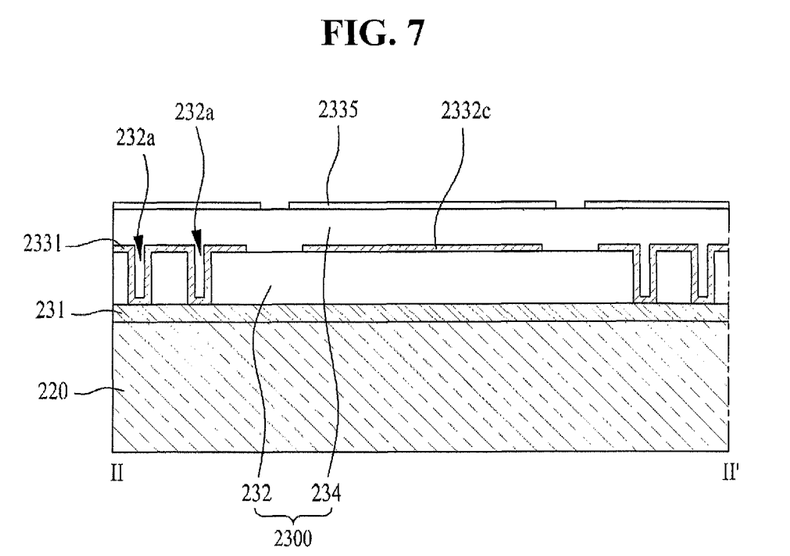
FIG. 7 is a sectional view taken along the II-II' line of FIG. 4.

FIG. 7 is a sectional view taken along the line of FIG. 4.

As shown in FIG. 7, the touch electrode array 230 includes a metal bridge 231 formed in the same layer as the metal pad layer 231a on the second buffer layer 220, a plurality of first transparent channel electrodes 2331 that are electrically connected to the metal bridge 231 while overlapping the metal bridge 231 and are spaced from one another in a first direction formed in the same layer as the transparent electrode pad layer 235a, and a connection portion 2332c that connects second transparent channel electrodes (represented by "2332" in FIG. 4) that traverse the metal bridge 231 and are formed in a second direction in an integrated form at the intersection of the metal bridge 231.

Also, the touch electrode array 230 may further include a common transparent electrode pattern 2335 covering the first and second transparent channel electrodes 2331 and 2332.

In this case, the touch electrode array 230 may further include a second insulating film 234 interposed between the first and second transparent channel electrodes 2331 and 2332, and the common transparent electrode pattern 2335.

If desired, the second insulating film 234 and the common transparent electrode pattern 2335 may be omitted. The common transparent electrode pattern 2335 functions to prevent effects of driving of the organic light emitting array (represented by "150" in FIG. 3) and thin film transistor array (represented by "140" in FIG. 3), when the touch electrode array 230 is adhered via an adhesive layer (represented by "400" in FIG. 3) to the organic light emitting diode (represented by "150" in FIG. 3) and the thin film transistor array (represented by "140" in FIG. 3). The common transparent electrode pattern 2335 covers the first and second transparent channel electrodes 2331 and 2332, and the connection portion of the second transparent channel electrode 2332c. In this case, the common transparent electrode pattern 2335 has a floating state.

Meanwhile, the touch electrode array 230 and the touch pad 2351b are disposed on the second buffer layer 220, and this configuration shows a state after the touch electrode array 230 is joined to the organic light emitting array 150. Substantially, formation of the touch electrode array 230 and the touch pad 2351b may be carried out in a state that the second substrate made of a glass component, including the touch electrode array 230 is not removed (described with reference to FIG. 2 above). The reason for this is that the second buffer layer 2230 may be vulnerable to chemicals used for heating and etching processes during the array process. If desired, when the second buffer layer 220 is sufficiently resistant to heat and chemicals used, the second substrate may be omitted.

Hereinafter, preferred embodiments of a configuration of a touch pad including a plurality of first contact holes in an organic light emitting display according to the present invention will be described in detail.

Figure 8A:
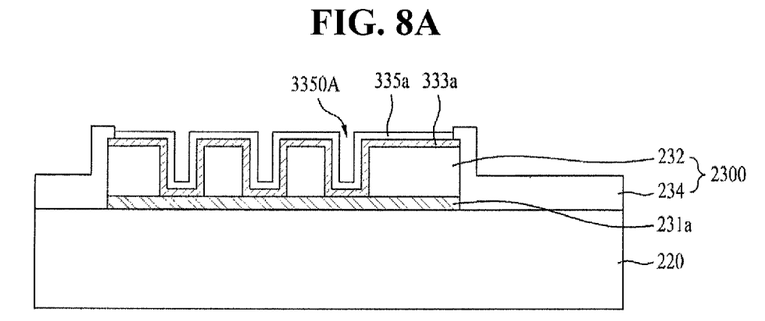
FIGS. 8A to 8C illustrate touch pads of an organic light emitting display according to embodiments of the present invention.
Figure 8B:
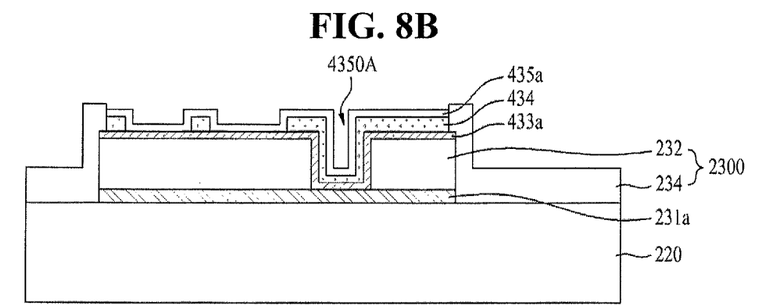
Figure 8C:
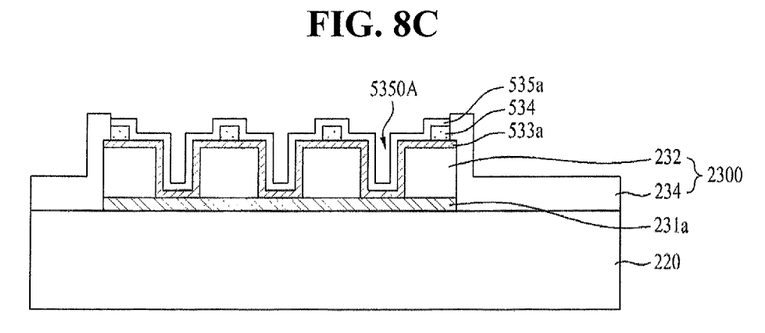

FIGS. 8A to 8C illustrate touch pads of an organic light emitting display according to embodiments of the present invention.

As shown in FIG. 8A, the touch pad portion according to the first embodiment of the present invention is formed in accordance with the following process.

That is, the formation of the touch pad of the touch pad portion is carried out in accordance with the following processes. First, a metal pad layer 231a is formed on the second buffer layer 220. The metal pad layer 231a may be formed by etching the same metal in the same layer as the metal bridge 231 of FIG. 7.

Subsequently, a first insulating film 232 including a plurality of first contact holes 3350A is formed on the metal pad layer 231a.

Subsequently, a first transparent electrode pad layer 333a is formed on the first insulating film 232 such that it is connected through the first contact hole 3350A to the metal pad layer 231a. The first transparent electrode pad layer 333a may be formed in the same layer as the first and second transparent channel electrodes 2331 and 2332.

Subsequently, a second insulating film 234 is formed adjacent to a neighboring portion of the touch pad 2351b such that it exposes the first transparent electrode pad layer 333a.

Subsequently, a second transparent electrode pad layer 335a which is the same layer as the common transparent electrode pattern (represented by "2335" in FIG. 7) of the active region may be further formed on the first transparent electrode pad layer 333a. Depending on presence of the common transparent electrode pattern (represented by "2335" in FIG. 7), presence of the second transparent electrode pattern 335a may be determined.

As described above, when the organic light emitting display includes the first contact holes 3350A, contact areas and contact sites of the conductive ball 455 corresponding to the touch pad 2351b are increased, electric properties between the thin film transistor array, and the dummy pad disposed in the same layer as the thin film transistor array which are electrically connected via the touch pad 2351b and the conductive ball 455 can be improved and as a result, resistance can be reduced.

Another embodiment exerting the same effects as the first embodiment will be described below.

FIG. 8B illustrates a touch pad according to a second embodiment of the present invention and the touch pad will be formed in accordance with the following process.

That is, the formation of the touch pad of the touch pad portion is carried out in accordance with the following processes. First, a metal pad layer 231a is formed on the second buffer layer 220. The metal pad layer 231a may be formed by etching the same metal in the same layer as the metal bridge 231 of FIG. 7.

Subsequently, a first insulating film 232 including a plurality of first contact holes 3350A is formed on the metal pad layer 231a.

Subsequently, a first transparent electrode pad layer 433a is formed on the first insulating film 232 such that it is connected through the first contact hole 4350A to the metal pad layer 231a. The first transparent electrode pad layer 333a may be formed in the same layer as the first and second transparent channel electrodes 2331 and 2332.

Subsequently, a second insulating film 234 is formed in a neighboring portion of the touch pad 2351b such that it exposes the first transparent electrode pad layer 433a.

Subsequently, a metal pattern 434 is formed in a predetermined region on the first transparent electrode pad layer 433a and in the first contact hole 4350A.

Subsequently, the second transparent electrode pad layer 435a that covers the metal pattern 434 and the exposed first transparent electrode pad layer 433a may be further formed in the same layer as the common transparent electrode pattern (represented by "2335" in FIG. 7) of the active region. Depending on presence of the common transparent electrode pattern (represented by "2335" in FIG. 7), presence of the second transparent electrode pattern 435a may be determined.

In this case, the metal pattern 434 having higher conductivity than that of the transparent electrode bypasses signals, thus reducing resistance of the touch pad, when the transparent electrode having low hardness is broken or short-circuited due to the conductive ball 455 during the bonding process.

As shown in FIG. 8C, the touch pad portion according to the third embodiment of the present invention is formed in accordance with the following process.

That is, formation of the touch pad of the touch pad portion is carried out in accordance with the following processes. First, a metal pad layer 231a is formed on the second buffer layer 220. The metal pad layer 231a may be formed by etching the same metal in the same layer as the metal bridge 231 of FIG. 7.

Subsequently, a first insulating film 232 including a plurality of first contact holes 5350A is formed on the metal pad layer 231a.

Subsequently, a first transparent electrode pad layer 533a is formed on the first insulating film 232 such that it is connected through the first contact hole 5350A to the metal pad layer 231a. The first transparent electrode pad layer 533a may be formed in the same layer as the first and second transparent channel electrodes 2331 and 2332.

Subsequently, a second insulating film 234 is formed in a neighboring portion of the touch pad 2351b such that it exposes the first transparent electrode pad layer 533a.

Subsequently, a metal pattern 534 is formed in a predetermined region on the first transparent electrode pad layer 533a. In this case, the metal pattern 534 may be formed between the first contact holes 5350A.

Subsequently, the second transparent electrode pad layer 435a that covers the metal pattern 534 and the exposed first transparent electrode pad layer 533a may be further formed in the same layer as the common transparent electrode pattern (represented by "2335" in FIG. 7) of the active region. Depending on presence of the common transparent electrode pattern (represented by "2335" in FIG. 7), presence of the second transparent electrode pattern 535a may be determined.

In this case, the metal pattern 534 having higher conductivity than that of the transparent electrode bypasses signals, thus reducing resistance of the touch pad, when the transparent electrode having low hardness is broken or short-circuited due to the conductive ball 555 during the bonding process.

Figure 9:
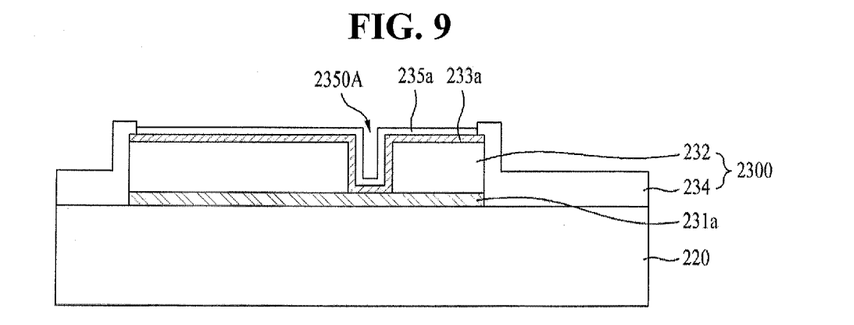
FIG. 9 is a reference embodiment, compared with FIG. 8A to 8C.

FIG. 9 is a reference embodiment, compared with FIG. 8A to 8C.

Comparing with the touch pads according to the first to third embodiments, the reference embodiment including one first contact hole 2350B will be described.

As shown in FIG. 9, the reference embodiment is the same as in the first embodiment, except that the first insulating film 232 includes one first contact hole 2350B.

For the first to third embodiments and the reference embodiment, defect levels are evaluated after bonding using a sealant including conductive balls interposed between the touch pad portion and the dummy pad portion.

As can be seen from Table 1 above, when photoacryl (PA) is used as the insulating film (first and second insulating films) material, and conditions of presence of first contact holes and presence of metal patterns are changed, a ratio of the total number of channels to the number of defective channels is changed. This ratio of the total number of channels to the number of defective channels is defined as a defect percentage. The reference embodiment has a defect percentage of about 25.5%, which means that electric contact properties of the conductive balls are bad after bonding.

On the other hand, the first to third embodiments according to the present invention have a low defect percentage of 5.3% or less. This means that, like the touch pad of the present invention, a plurality of first contact holes are provided or a metal pattern is further formed between the metal pad layer and the transparent electrode pad layer in one touch pad, thus increasing a contact area and number of contact sites where the conductive balls contact the surface of the touch pad and improving electric connection.

Here, Ref is a conductivity simulated in respective sites and a defect percentage may be 20% or less, when Ref is about 8,000 or more.

Figure 10A:
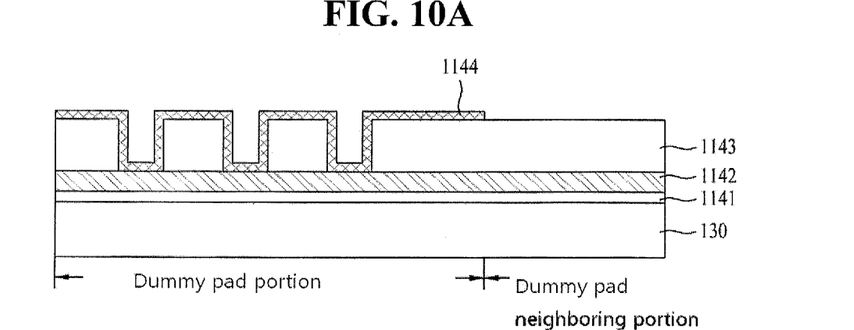
FIG. 10A illustrates a thin film transistor dummy pad corresponding to the touch pad of an organic light emitting display according to an embodiment of the present invention.
Figure 10B:
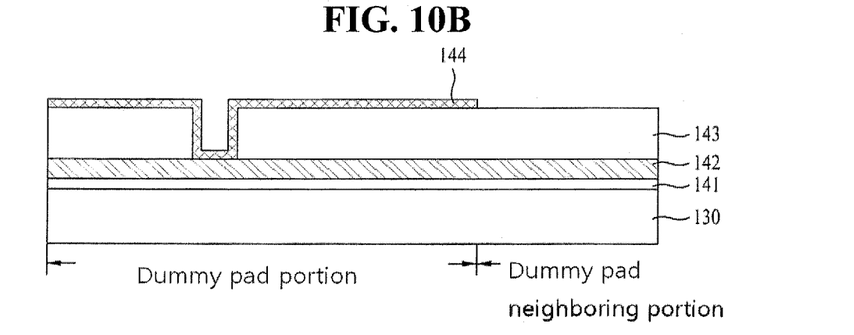
FIG. 10B is an embodiment modified from the embodiment of FIG. 10A.

FIG. 10A illustrates a thin film transistor dummy pad corresponding to the touch pad of an organic light emitting display according to the present invention. FIG. 10B is an embodiment modified from the embodiment of FIG. 10A.

Here, although not shown, a thin film transistor pad that applies a signal to the thin film transistor array is formed on the same plane on which the thin film transistor dummy pad is formed.

As shown in FIG. 10A, each dummy pad of the organic light emitting display according to the present invention includes a gate metal pad layer 1142 and a source pad layer 1144 connected to each other via the third insulating film 1143 including a plurality of second contact holes 1143A interposed therebetween on the first buffer layer 130.

Here, a gate insulating film 1141 may be further formed under the gate metal pad layer 1142 on the first buffer layer 130.

FIG. 10B illustrates a modified embodiment of the dummy pad according to the present invention. The number of contact holes formed in the third insulating film 1143 between the gate metal pad layer 1142 and the source pad layer 144 is only one.

The embodiments of FIGS. 10A and 10B can reduce contact defects after the bonding process, when the dummy pads correspond to the touch pads of the first to third embodiments of the present invention. As shown in FIG. 10A, when the second contact hole 1143A is present in plural, defect percentage can be further reduced.

Also, since the dummy pad formed in the first buffer layer 130 directly contacts conductive balls, the source pad layer 144, which is harder than the transparent electrode, is

TABLE 1

| Conditions | Touch pad | | | | | | |
|---|---|---|---|---|---|---|---|
| | Insulating film material | Presence of a plurality of first contact holes | Presence of metal pattern | Number of defective channels (EA) | Total number of channels (EA) | Defect percentage (%) | REF |
| Reference embodiment | PA | X | X | 130 | 510 | 25.5 | 7457 |
| First embodiment | PA | ○ | X | 30 | 570 | 5.3 | 8566 |
| Second embodiment | PA | X | ○ | 23 | 900 | 2.6 | 9175 |
| Third embodiment | PA | ○ | ○ | 26 | 690 | 3.8 | 9097 | disposed in an upper part, the source pad layer 144 is not readily cracked, as compared to the touch pad, although pressure is applied by the conductive ball 455 during the bonding process. Accordingly, the dummy pad may be applied to both the embodiment of FIG. 10A and the embodiment of FIG. 10B.

Figure 11:
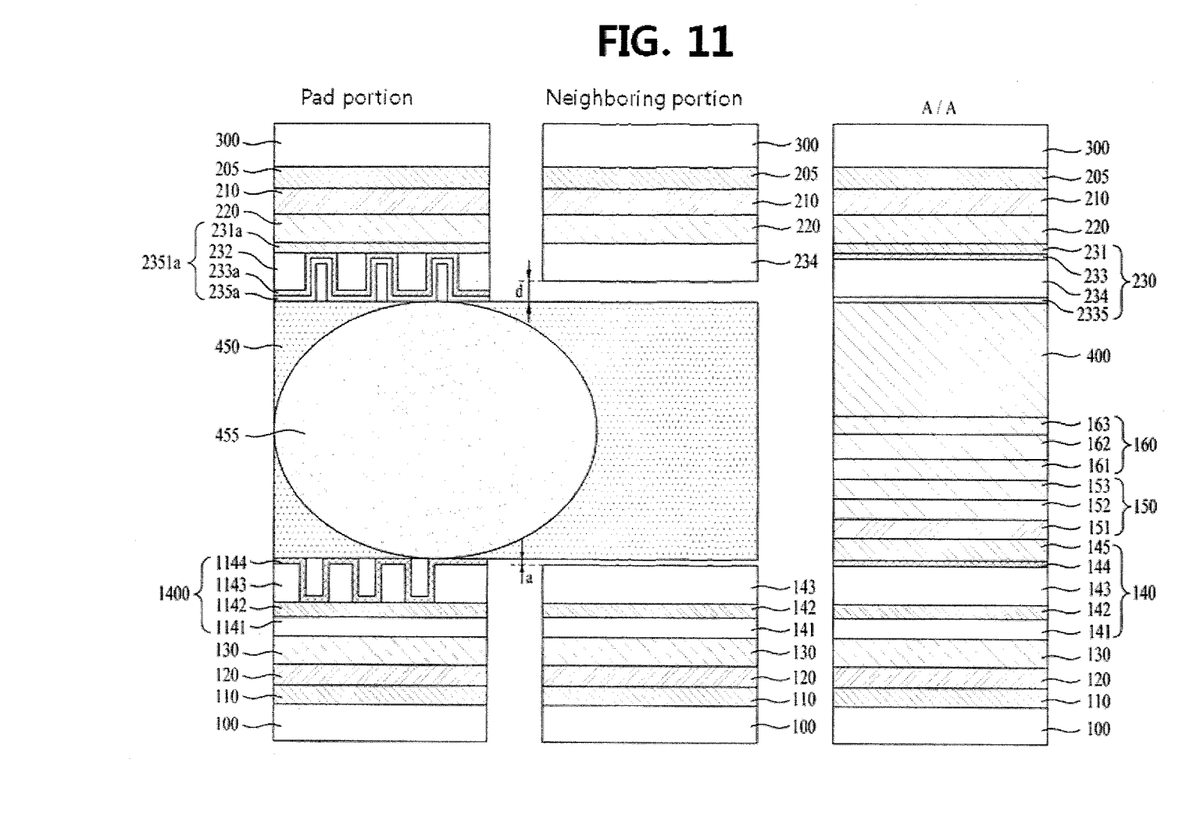
FIG. 11 is a sectional view illustrating a pad portion, a neighboring portion and an active region of the organic light emitting display of the present invention.

FIG. 11 is a sectional view illustrating a pad portion, a neighboring portion and an active region of the organic light emitting display of the present invention.

As shown in FIG. 11, the organic light emitting display of the present invention includes a first buffer layer 130 and a second buffer layer 220 which include an active region and a dead region, and face each other, a thin film transistor array 140 including a thin film transistor in each of pixels defined in a matrix form in the active region of the first buffer layer 130, an organic light emitting array 150 including an organic light emitting diode connected to the thin film transistor of each pixel, a protective layer 160 formed on the first buffer layer 130 such that it covers the thin film transistor array 140 and the organic light emitting array 150, a touch electrode array 230 formed in the active region of the second buffer layer 220, an adhesive layer 400, the top and bottom of which contact the protective layer 160 and the touch electrode array 230, respectively, a touch pad portion (represented by "2350" in FIG. 2) in a predetermined part of the dead region of the second buffer layer 220, a dummy pad portion formed in the dead region of the first buffer layer 130 such that it faces the touch pad portion, and a sealant 450 including a plurality of conductive balls 455, including interposed between the touch pad portion and the dummy pad portion.

Also, the touch pad portion includes a plurality of touch pads 2351*b*, and the dummy pad portion includes dummy electrodes 1400 corresponding to the touch pads 2351*b*.

Here, the distance between the outermost surface of the touch pad 2351*b* and the outermost surface of the dummy electrode 1400 in the pad portion is smaller than the distance in the neighboring portion. In the illustrated drawing, the distance in the pad electrode is "a+d" smaller than the distance in the pad electrode neighboring portion.

In this case, a first distance "a" represents a distance between the sealant 450 and an intermediate insulating film 143, as a result of removal of the source metal layer 144 from the pad electrode neighboring portion in the thin film transistor array 140 and a second distance "d" represents a distance between the second insulating film 234 and the sealant 450 in the pad electrode neighboring portion.

According to the present invention, a first interlayer insulating film 232 corresponding to the touch pad portion is further provided, although the second interlayer insulating film 234 included in the pad electrode neighboring portion adjacent thereto is thicker than the metal layer or transparent electrode layers, the first interlayer insulating film 232 having a similar thickness thereto is also provided in the touch pad 2351*b*, and the touch pad 2351*b* is formed to have a step higher than the neighboring portion.

That is, the touch pad portion includes a plurality of touch pads 2351*b* two-dimensionally spaced from one another, each touch pad 2351*b* includes the first interlayer insulating film 232 between the metal pad layer 231*a* and the first transparent electrode pad layer 233*a*, in a vertical structure, in addition to the metal pad layer 231*a*, the first transparent electrode pad layer 233*a* and the second transparent electrode pad layer 235*a*, thereby securing a sufficient step. In the illustrated drawing, only the first interlayer insulating film 232 is provided between the electrode layer and the transparent electrode pattern, but the present invention is not limited thereto. By further providing two or more interlayer insulating films, the step between the touch pad portion and the pad electrode neighboring portion may be maximized. Here, the interlayer insulating film included in the touch pad 2351*b* is formed during formation of the touch electrode array 230 and is a component that can be provided without an additional process.

Here, only a part of the touch pad 2351*b* is shown. The first contact hole 3350A is provided in a part of the first interlayer insulating film 232 between the metal pad layer 231*a* and the first transparent electrode pad layer 233*a*, to enable electric connection.

Meanwhile, the dummy electrode 1400 has a configuration in which a gate insulating film 141, a gate electrode layer 142, an intermediate insulating film 143 and a source metal layer 144 are laminated in this order on the first buffer layer 130.

The conductive ball 455 in the sealant 450 is connected to the touch pad 2351*b* and the dummy electrode 1400 disposed in the upper and lower parts even upon application of low pressure during the bonding process, since the touch pad neighboring portion has an "a+d" greater distance than the touch pad, thus improving contact characteristics. As a result, after the bonding process, the conductive ball 455 is pressed to a predetermined thickness between the touch pad portion and the dummy pad portion. This structure causes a decrease in contact resistance, improvement in contact characteristics and thus improvement in touch signal sensitivity.

In this case, a second distance "d" is present between the second interlayer insulating film 234 and the sealant 450 in the dead region of the touch pad portion neighboring portion, and a first distance "a" is present between the intermediate insulating film 143 and the sealant 450 in the dummy electrode neighboring portion.

Meanwhile, one or more interlayer insulating films 234 and 232 are preferably organic films. This aims at providing interlayer insulation between the electrode layer and the transparent electrode pattern in the touch electrode array 230 and securing a predetermined thickness between the metal layer and the transparent electrode pattern which are different layers.

A flat layer 145 may be further provided on the outermost surface of the thin film transistor array 140 in the active region.

Also, the touch electrode array 230 of the active region includes the metal bridge 231 formed in the same layer as the metal pad layer 231*a* on the second buffer layer, a plurality of first transparent channel electrodes (represented by "2331" in FIG. 10A) which are electrically connected to the metal bridge 231, while overlapping the metal bridge 231 and are spaced from one another in a first direction in the same layer as the transparent electrode pattern 233*a*, and a transparent metal layer 233 that includes a second transparent channel electrode 2332 that traverses the metal bridge and is formed in a second direction in the same layer as the first transparent channel electrode.

In the illustrated drawing, the transparent metal layer 233 constituting the first and second transparent channel electrodes and a common transparent electrode 2335 overlapping the transparent metal layer 233 via the second interlayer insulating film 234 are present. If desired, the common transparent electrode 2335 may be omitted. The common transparent electrode 2335 is a floating state which functions to shield effects of driving signals of the opposite thin film transistor array or organic light emitting array on the touch electrode array 230.

In this case, the touch pad 2351a of the touch pad portion may also include a common transparent electrode pattern 235a that overlaps the transparent electrode pattern 233a and is connected to the transparent electrode pattern 233a.

Here, in the dead region of the touch pad portion neighboring portion, at least one interlayer insulating film (in the drawing, first interlayer insulating film) may be removed.

Meanwhile, non-described reference numeral "145" represents a passivation layer 145 formed on the outermost surface of the thin film transistor array 140 in the active region.

Also, the organic light emitting array 150 includes an anode 151, an organic light emitting layer 152 and a cathode 153. This configuration is a minimal unit. A bank (not shown) may be included between pixels in order to isolate the organic light emitting layer 152 into pixel units, and an organic layer may be added or changed in order to improve luminous efficacy between the anode 151 and the cathode 153.

Also, first and second etching stopper films 120 and 210 may be formed on the bottom of the first buffer layer 130 and the second buffer layer 220, respectively. The first etching stopper film 120 and the second etching stopper film 210 may be formed of polyimide or photoacryl.

In this case, after the bonding process, a film substrate (represented by "1000" in FIG. 2) may be further formed on the bottom of the first etching stopper film 120. Here, the film substrate 1000 may be formed of a plastic insulating film for realization of thinness and flexibility.

Also, after removal of the substrate (glass), a cover glass (represented by "3000" in FIG. 2) may be further formed on the second etching stopper film 210.

Meanwhile, the first buffer layer 130 and the second buffer layer 220 may have a laminate structure including a plurality of inorganic films.

Also, the protective layer 160 includes an inorganic film 161, an organic film 162 and an inorganic film 163 which are laminated in this order. Based on the structure including organic and inorganic films which are alternately laminated, the protective layer 160 primarily functions to prevent permeation of moisture into the organic light emitting array 150.

Also, not-described reference numerals "205" and "110" represent a nitride layer and an amorphous semiconductor layer, respectively, to protect arrays. These layers may be removed together with the adjacent substrate during removal of the glass after the bonding process.

The organic light emitting display of the present invention includes an in-cell touch electrode array in a lower part of the cover glass. For this purpose, the touch pad prepared to drive the touch electrode array faces the first buffer layer including the organic light emitting array. Also, FPBC bonding is performed by connecting the dummy pad and the touch pad formed in the first buffer layer through the sealant including the conductive ball.

In this case, in order to improve contact characteristics between the dummy pad and the touch pad and yield, the contact hole included in the metal pad layer of the touch pad and the transparent electrode pad layer is provided in plural, thereby increasing a contact area and the number of contact portions when the conductive ball faces the touch pad. Through this structure change, although a high pressure is applied by the conductive balls during a bonding process, the pressure can be distributed to the plurality of contact holes, thereby preventing breakage of transparent electrode pad layer having a lower hardness. The metal pattern can bypass electric signals by providing a metal pattern between the transparent electrode pad layer and the metal pad layer, although the transparent electrode pad layer is partially broken by the pressure, thus preventing an increase of resistance of contact portion. As a result, touch sensitivity can be improved.

The organic light emitting display and the method for manufacturing the same according to the present invention has the following advantages.

The organic light emitting display of the present invention includes an in-cell touch electrode array in a lower part of the cover glass. For this purpose, the touch pad provided to drive the touch electrode array faces the first buffer layer including the organic light emitting array. Also, FPBC bonding is performed by connecting the dummy pad formed in the first buffer layer and the touch pad via the sealant including the conductive ball. In this case, in order to improve contact characteristics between the dummy pad and the touch pad and yield, the contact hole included in the metal pad layer of the touch pad and the transparent electrode pad layer is provided in plural, thereby increasing a contact area and the number of contact portions when the conductive ball faces the touch pad.

Through this structure change, although a high pressure is applied by the conductive ball during a bonding process, the pressure can be distributed on the plurality of contact holes, thereby preventing breakage of transparent electrode pad layer having a lower hardness. The metal pattern can by-pass electric signals by providing a metal pattern between the transparent electrode pad layer and the metal pad layer, although the transparent electrode pad layer is partially broken by the pressure, thus preventing an increase of resistance of a contact portion.

As a result, touch sensitivity can be improved.

Also, the touch pad portion is provided inside of the cover glass, the touch pad portion is connected to the thin film transistor pad portion via the conductive ball, and all of the touch electrode array, the thin film transistor array, and the organic light emitting array can transfer signals through one chip included in the thin film transistor pad portion, One chip is connected to one flexible printed board, thus simplifying a pad portion and circuit configurations of the organic light emitting display. As a result, slimness and reduction in cost can be realized.

Also, the organic light emitting display according to the present invention has an in-cell structure in which the touch electrode array is included in the cover glass, thus requiring no additional process for attaching a touchscreen, enabling slimness and realizing displays manufactured in a simple process.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for manufacturing an organic light emitting display comprising:

forming a first etching stopper film and a first buffer layer on a first substrate, and forming a transistor-organic light emitting diode array having a transistor in each of pixels defined in a matrix form and an organic light emitting diode connected to the transistor in an active region of the first buffer layer;

forming a second etching stopper film and a second buffer layer on a second substrate and forming a touch electrode array in an active region of the second buffer layer;

forming a touch pad portion in a part of a dead region of the second buffer layer, wherein the touch pad portion comprises a plurality of touch pads and each of the touch pads comprises a metal pad layer and a transparent electrode pad layer connected to each other via a plurality of first contact holes in a first insulating film;

forming a dummy pad portion in a dead region of the first buffer layer, wherein the dummy pad portion comprises a plurality of dummy pads, each dummy pad corresponding to each touch pad; and applying a sealant including a conductive ball to the touch pad portion or the dummy pad portion, attaching an adhesive layer to the touch electrode array or the transistor-organic light emitting diode array and joining the first substrate to the second substrate.

2. The method according to claim 1, wherein the conductive ball laterally contacts at least one of the plurality of first contact holes inside at least one of the plurality of first contact holes.

3. The method according to claim 2, wherein a diameter of the first contact hole is smaller than a diameter of the conductive ball and the plurality of first contact holes correspond to one conductive ball.

4. The method according to claim 3, wherein the forming each touch pad of the touch pad portion comprises:
    forming a metal pad layer on the second buffer layer;
    forming a first insulating film comprising a plurality of first contact holes on the metal pad layer;
    forming a transparent electrode pad layer on the first insulating film such that the transparent electrode pad layer is connected to the metal pad layer through the first contact hole.

5. The method according to claim 4, wherein the transparent electrode pad layer comprises a first transparent electrode pad layer and a second transparent electrode pad layer which are disposed in different layers.

6. The method according to claim 5, wherein the forming each touch pad comprises: horizontally disposing a plurality of metal patterns between the first contact hole and vertically disposing the plurality of metal patterns between the first transparent electrode pad layer and the second transparent electrode pad layer.

7. The method according to claim 1, wherein the forming the dummy pad of the dummy pad portion comprises:
    forming a gate metal pad layer on the first buffer layer;
    forming a third insulating film including a plurality of second contact holes on the gate metal pad layer; and
    forming a source pad layer on the third insulating film such that the source pad layer is connected through the second contact holes to the gate metal pad layer.

8. The method according to claim 1, wherein, after joining, the conductive ball is compressed to a predetermined to a thickness between the touch pad portion and the dummy pad portion.

9. The method according to claim 8, wherein, after joining, the dead region of the touch pad portion neighboring portion is spaced from the sealant by a predetermined distance.

10. The method according to claim 1, further comprising:
    removing the first substrate and the second substrate; and
    adhering a film substrate to an exposed surface of the first etching stopper film.

11. The method according to claim 10, wherein the removing the first substrate and the second substrate is carried out by etching or laser-irradiating the first substrate and the second substrate.

* * * * *